US012647735B2

(12) United States Patent
Stoppel et al.

(10) Patent No.: US 12,647,735 B2
(45) Date of Patent: Jun. 2, 2026

(54) MEMS SOUND TRANSDUCER

(71) Applicant: Fraunhofer-Gesellschaft zur Förderung der angewandten Forschung e.V., Munich (DE)

(72) Inventors: Fabian Stoppel, Itzehoe (DE); Malte Florian Niekiel, Itzehoe (DE); Bernhard Wagner, Itzehoe (DE); Fabian Lofink, Itzehoe (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 152 days.

(21) Appl. No.: 18/626,372

(22) Filed: Apr. 4, 2024

(65) Prior Publication Data

US 2024/0340597 A1      Oct. 10, 2024

(30) Foreign Application Priority Data

Apr. 6, 2023      (DE) ..................... 10 2023 203 237.6

(51) Int. Cl.
H04R 17/02      (2006.01)
B81B 3/00      (2006.01)

(52) U.S. Cl.
CPC ........... H04R 17/02 (2013.01); B81B 3/0021 (2013.01); B81B 2203/0118 (2013.01); H04R 2201/003 (2013.01)

(58) Field of Classification Search
CPC .............. H04R 17/02; H04R 2201/003; B81B 3/0021; B81B 2203/0118
See application file for complete search history.

(56) References Cited

U.S. PATENT DOCUMENTS 9,237,961 B2      1/2016      Mitchell
10,349,182 B2      7/2019      Stoppel
(Continued)

FOREIGN PATENT DOCUMENTS

DE      10 2017 208 911 A1      11/2018
DE      10 2021 202 573 A1      7/2022
(Continued)

OTHER PUBLICATIONS

Machine translation of DE 102021203360 A1), Niekiel et al.; 2022 (Year: 2022).*
(Continued)

*Primary Examiner* — Andrew Sniezek
(74) *Attorney, Agent, or Firm* — McClure, Qualey & Rodack, LLP

(57)      ABSTRACT

An MEMS sound transducer having: a deflectable bending transducer element which is clamped on at least one side relative to a surrounding structure, the bending transducer element having a free end on at least one side, which is separated from the surrounding structure by a gap, the deflectable bending transducer element being configured to be subjected to bending along a bending line and/or torsion along a torsion axis as a result of a force in order to be deflected as a result of the bending, the deflectable bending transducer element having at least one screen structure which projects vertically from one of the main directions of extension of the bending transducer element and is implemented to be flexible at least along the bending line and/or along the torsion axis.

15 Claims, 7 Drawing Sheets

(56) References Cited

U.S. PATENT DOCUMENTS

| 11,350,217 | B2 | | 5/2022 | Stoppel | |
| 2020/0100033 | A1 | * | 3/2020 | Stoppel | H04R 31/003 |
| 2022/0396470 | A1 | * | 12/2022 | Leahy | B81B 3/0021 |
| 2023/0421947 | A1 | | 12/2023 | Stoppel | |
| 2024/0048899 | A1 | * | 2/2024 | Niekiel | B06B 1/02 |

FOREIGN PATENT DOCUMENTS

| DE | 102021203360 | A1 | * | 10/2022 | H04R 17/00 |
| EP | 3 632 135 | A2 | | 4/2020 | |

OTHER PUBLICATIONS

Stoppel, F., et al.; "New integrated full-range MEMS speaker for in-ear applications;" IEEE Micro Electro Mechanical Systems (MEMS); Jan. 2018; pp. 1068-1071.

Shahosseini I., et al.; "Optimization and Microfabrication of High Performance Silicon-Based MEMS Microspeaker;" IEEE Sensors Journal; vol. 13; No. 1; Jan. 2013; pp. 273-284.

Ayatollahi, F.L., et al.; "Materials Design and Analysis of Low-Power MEMS Microspeaker Using Magnetic Actuation Technology;" Advanced Materials Research; vol. 74; 2009); pp. 243-246.

Chen, Y.C., et al.; "A low-power milliwatt electromagnetic microspeaker using a PDMS membrane for hearing aids application;" IEEE Int. Conf. Micro Electro Mech. Syst., 24th; Jan. 2011; pp. 1213-1216.

Cheng, M.C., et al.; "A silicon microspeaker for hearing instruments;" Journal of Micromechanics and Microengineering 14; 2004; pp. 859-866.

Je, S.S., et al.; "A Compact and Low-Cost MEMS Loudspeaker for Digital Hearing Aids;" IEEE Transactions on Biomedical Circuits and Systems; Nov. 2009; pp. 348-358.

Majlis, B.Y., et al.; "Compact electrodynamics MEMS-speaker;"China Semiconductor Technology International Conference (CSTIC); IEEE; 2017; pp. 1-3.

Jadhav, P.R., et al.; "A sub-mW Electromagnetic Microspeaker with Bass Enhancement using Parylene/Graphene/Parylene Composite Membrane;" IEEE Micro Electro Mechanical Systems (MEMS); Jan. 2018; pp. 620-623.

Albach, T.S., et al.; "Sound Generation Using a Magnetostrictive Micro Actuator;" Journal of Applied Physics; Mar. 2011; pp. 1-4.

Kaiser, B., et al.; "Concept and proof for an all-silicon MEMS micro speaker utilizing air chambers;" Microsystems & Nanoengineering; 2019; pp. 1-11.

* cited by examiner bending transducer        12        screen element 18        14s

14 decoupling slot

14k substrate bending transducer 12e        12_1        adjacent structure (e.g. substrate)

14

18        18

12s1

14sm        12s2

18        18 screen element        14s 12e        12_2        decoupling slot bending transducer screen element

18 adjacent structure
(e.g. substrate)

18'

18"

18''' passive layer piezoelectric layer

MEMS SOUND TRANSDUCER

CROSS-REFERENCE TO RELATED APPLICATION

This application claims priority from German Application No. 10 2023 203 237.6, which was filed on Apr. 6, 2023, which is incorporated herein by reference in its entirety.

TECHNICAL FIELD

Embodiments of the present invention relate to an MEMS sound transducer, in particular an MEMS sound transducer with one or more screens. In particular, the embodiments of the present invention describe a concept for electroacoustic sound conversion which is fully compatible with MEMS manufacturing processes.

BACKGROUND OF THE INVENTION

As a development of conventional loudspeakers, micro loudspeakers have emerged from miniaturizing the established electrodynamic drive. In the most widespread moving coil arrangement, a coil is attached to the back of the membrane, which moves in the magnetic field of a fixed permanent magnet when applying a current signal, thus deflecting the membrane.

One development from hearing aid applications is the so-called balanced armature transducer (BA transducer). A coil-wound rod is located in the gap of a ring-shaped permanent magnet and is connected to a membrane. A current signal on the coil magnetizes the rod, on which a torque acts due to the magnetic field of the permanent magnet. The rotation is transmitted to the membrane via a rigid connection. In its basic state, the rod is in an unstable equilibrium of magnetic forces of attraction. Due to this unstable state, higher deflections can be achieved with less effort (drive forces, energy). BA transducers are therefore characterized by higher achievable sound pressure levels and are preferred for in-ear applications due to their size.

Driven by the demand for miniaturization and inspired by the successes in the field of microphones, microsystems technology has adopted the topic of micro loudspeakers. A development by Fraunhofer ISIT in cooperation with the USound company resulted in a MEMS loudspeaker based on piezoelectric bending actuators which deflect a membrane applied in a hybrid manner [1].

Further developments by Fraunhofer ISIT are based on piezoelectric bending actuators which can do without an additional membrane [2,3]. The actuators are mechanically decoupled via thin slots and act as an acoustically radiating membrane. Small gap widths of a few micrometers and optional flow screens prevent an acoustic short circuit and allow high sound pressure levels despite the mechanically open design.

Various concepts of electrodynamically actuated MEMS loudspeakers are also known. The work at the Université Paris-Sud and the Université du Maine [4,5] is particularly worth mentioning. A stiffened Si membrane suspended on Si springs forms a piston transducer. The coil is applied directly to the Si membrane as a planar coil and moves the membrane in the magnetic field of a permanent magnet applied in a hybrid manner.

A related approach, pursued by several groups [6,7,8,9, 10,11], is to apply the planar coil to a soft polymer membrane, instead of the stiffened Si membrane.

The concept of a magnetostrictively driven micro loudspeaker is pursued by Albach et al [12]. The sound transducer here consists of a two-part structure. The first part is a micro loudspeaker chip carrying the magnetostrictive membrane of the loudspeaker. By applying a magnetic field, the membrane is deflected out of the plane of the chip and sound is generated. The second part of the micro loudspeaker is a coil, through which a current flows, generating the magnetic field required for operation. The concept proposed here provides for a second chip which carries the corresponding micro flat coils.

Another micro loudspeaker concept is based on the nanoscopic electrostatic drive (NED) [13]. The device comprises clamped electrostatic bending actuators arranged in pairs in rows and columns within the device layer of a silicon on insulator (SOI) wafer and covered with another wafer, which is bonded to the SOI wafer with a small gap. Acoustically effective openings are alternately integrated into the top and bottom of the wafer, between each adjacent row of actuators, to allow sound to be emitted from the device without acoustic short-circuiting.

In summary, it is to be noted that the existing MEMS loudspeaker concepts predominantly require complex, expensive and, in some cases, hybrid manufacturing methods and predominantly exhibit insufficient performance characteristics. From this point of view, the approach with piezoelectric bending transducers and fixed flow screens [2] is currently considered to be particularly promising since it combines good performance characteristics with comparatively good manufacturability in MEMS technology.

The object underlying the present invention is to provide a concept for an MEMS sound transducer offering an improved compromise between acoustic properties, manufacturability, miniaturizability and complexity.

SUMMARY

Embodiments of the present invention provide an MEMS transducer comprising a deflectable bending transducer element which is clamped on at least one side relative to a surrounding structure, wherein the bending transducer element comprises a free end on at least one side, e.g. laterally, i.e. adjacent to a clamped end of the bending transducer element, which is separated from the surrounding structure by a gap. The deflectable bending transducer element is configured to be subjected to bending along a bending line and/or torsion along a torsion axis as a result of a force in order to be deflected as a result of the bending. For example, the force can be generated by an incoming sound wave or by an actuator which deflects the bending transducer element based on an electrical signal. The deflectable bending transducer element comprises at least one screen structure which projects vertically from one of the main directions of extension of the bending transducer element and is implemented to be flexible at least along the bending line and/or along the torsion axis.

Embodiments of the present invention are based on the finding that MEMS sound transducers, in particular MEMS sound transducers having bending transducer elements, can be effectively sealed on the one hand by using screen (or diaphragm) structures which extend along an edge of the bending transducer element, for example, in order to prevent acoustic short-circuiting. To prevent stiffening of the bending sound transducer by the screen structure, it is implemented to be flexible. The flexibility can be achieved, for example, by a comb-like setup of the screen structure. Compared to previous MEMS systems, which are usually based on closed membranes, the present concept allows a significant increase in performance. One reason for this is that no energy has to be provided for the deformation of additional mechanical membrane elements, as a result of bending transducer decoupling, thereby allowing higher deflections and forces. It is possible to avoid a closed structure by using the screen structures. In addition, non-linearities only occur with significantly larger movement amplitudes. Due to the low oscillating mass, resulting from the concept and material, systems with an extraordinarily broad frequency range and simultaneously high movement amplitudes can be realized. In contrast to sound transducers having a fixed screen [2], in the present embodiments, advantages in terms of production technology result, among other things. For example, the screen may consist of a substrate material and be defined simultaneously with the structuring of the substrate. Applying a screen element made from the substrate can be omitted here.

Further advantages are:

High cost savings since hybrid assembly or process integration of a membrane can be dispensed with.

Due to the concept, several sound transducers can be integrated on one chip, e.g. for the realization of particularly space-saving multi-way loudspeakers or the combination of sound generators and receivers. In addition, the frequency-separated control in combination with the piezoelectric drives achieve significant increases in energy efficiency. Good mode decoupling also offers advantages in terms of reproduction quality.

In contrast to previous systems, which usually have no sensors or only detect deflection of the actuator (not the membrane), this principle allows the actual position of the sound-generating element to be determined with the help of the easily integratable sensors. This is a great advantage and allows considerably more accurate and reliable detection. This forms the basis for controlled excitation (closed loop), for example, using which external influences, ageing effects and non-linearities can be electronically compensated for.

While conventional systems sometimes require complex-shaped membranes or magnets, which have not yet been realized in MEMS technology and can only be integrated at great expense in hybrid manner, the present concept can be realized using conventional silicon technology methods. This offers significant advantages in terms of production and costs.

The screen elements and their manufacturing process can be used for other functions. For example, they can be used as stiffening structures to suppress parasitic vibration modes in the bending transducer or to shift them in the frequency range. In addition, they can form mechanical overload protection (mechanical stop) or serve as damping structures, e.g. to adjust the quality of the bending transducer.

At this point, it is to be noted that the deflectable screen element extends at least in a first direction, e.g. the longitudinal direction, and can also extend in a second direction, e.g. the transverse direction. The bending line or torsion axis is along this first direction. The first and second directions are both located in the substrate plane or a plane formed by the deflectable bending transducer element and the surrounding structure. Thus, this means that, according to embodiments, the surrounding structure and the deflectable bending transducer element are located in the same plane. This applies, for example, at least for the rest state.

As already mentioned above, the screen structure can exhibit flexibility in that one or more decoupling slots are provided. According to embodiments, these decoupling slots may extend vertically relative to the screen structure so that, for example, a kind of comb shape is introduced into the screen structure. According to embodiments, the one or more decoupling slots have a constant thickness and/or a constant spacing. The advantage of these decoupling slots or recesses between the comb teeth is that they are easy to produce since no other materials can be used and flexibility is achieved at the same time. According to embodiments, such flexible screen structures are located at the edges which engage directly with the clamped end. According to embodiments, the deflectable bending transducer is only firmly clamped on one side. The free ends are then adjacent to this clamped side and opposite. A screen element can also be opposite, although this does not necessarily have to be flexible, but may be. According to embodiments, the screen structures may extend both on the first and on the second or even on both main surfaces of the deflectable bending transducer structure. This means that the one or more screen structures may extend into the substrate plane and out of the substrate plane.

According to embodiments, the screen structure may be curved and/or have a stop.

As already mentioned above, the screen structure serves to effectively prevent the gap from being sealed due to high viscosity losses at a thin gap, even if the gap gapes open due to the deflection. For example, the gap can be assumed to have a thickness of <20 µm, <10 µm or even <5 µm. In general, the thickness is therefore in the range of 0.1 µm or 1 µm or 20 µm. In order to achieve good sealing by the screen element with such a gap, it can have a height of 1 µm or at least 1 µm, at least 5 µm, at least 50 µm, at least 200 µm, at least 400 µm or at least 800 µm, for example.

It is to be noted at this point that, according to embodiments, the deflectable bending transducer element can have a piezo layer, a piezo layer and a passivation layer or two piezo layers with a passivation layer therebetween, configured to provide the force for deforming the bending transducer. Alternatively, electrical signals can also be achieved via these piezo layers based on a deformation which is reduced externally.

This means that, according to embodiments, the sound transducer is configured to emit a sound signal when excited by an electrical signal, or configured to provide an electrical signal as a function of the sound signal, starting from a sound signal impinging on the deflectable bending transducer element.

According to embodiments, the sound transducer has a further deflectable bending transducer element. According to embodiments, this further deflectable bending transducer element can be arranged opposite the (first) deflectable bending transducer element so that the free ends of the deflectable bending transducer element and of the further deflectable bending transducer element form a gap. According to embodiments, one or more screen structures may then be provided here. According to a further embodiment, the further deflectable bending transducer element can therefore be regarded as the surrounding structure.

BRIEF DESCRIPTION OF THE DRAWINGS

Embodiments of the present invention will be explained below referring to the figures, in which.

DETAILED DESCRIPTION OF THE INVENTION

Figure 1:
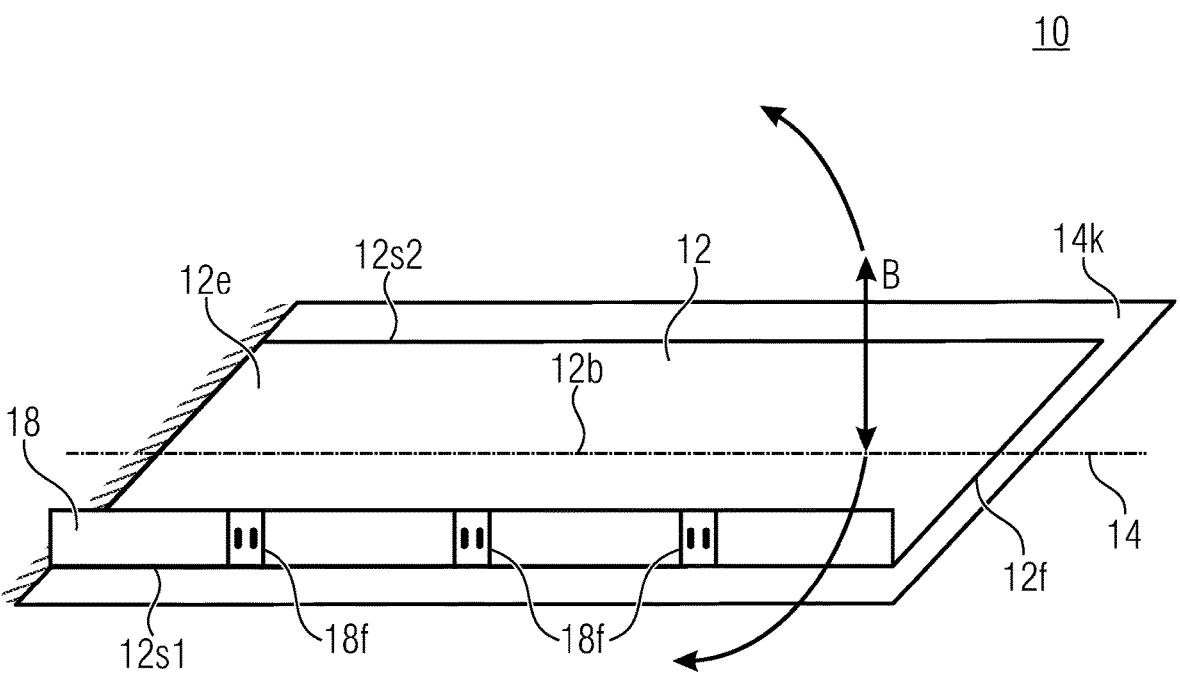
FIG. 1 shows a schematic illustration of a sound transducer having a bending actuator and a screen structure, according to a basic embodiment.

Before the following embodiments of the present invention are explained with reference to the appended drawings, it is to be noted that elements and structures having the same effect are provided with the same reference numerals so that the description thereof is mutually applicable or interchangeable. FIG. 1 shows an MEMS transducer 10 having a bending actuator 12, which is surrounded by a structure 14, in this case a substrate. For example, a cavity 14k is arranged in the substrate, into which the bending transducer 12 is embedded. One end of the bending transducer (see reference numeral 12e) is firmly clamped, i.e. firmly connected to the surrounding structure 14. The three other sides of the bending transducer are assumed to be free ends, wherein in particular the end 12f can be described as a free end and the sides 12s1 and 12s2 are also free ends, wherein bending of the bending transducer 12 takes place along these sides 12s1 and 12s2, as will be explained below.

The bending transducer 12 is configured to perform a movement B, e.g. as a reaction to an externally applied electrical signal or an externally applied sound signal. The movement B follows a circular path or C-shape around the clamped end 12e. This causes the (elongated) bending transducer 12 to bend along its longitudinal axis. This longitudinal axis or bending line 12b is illustrated and extends here from the clamped end 12e to the free end 12f along the sides 12s1 and 12s2. It is to be pointed out that this bending line may, for example, be parallel to the sides 12s1 and 12s2, but an oblique course of the axis, e.g. diagonally, is also possible. It would also be conceivable for torsion to take place instead of bending. In general, a bending line is determined, for example, by the fact that a (e.g. mathematically describable) curve is created during deformation, wherein this bending line is straight in the rest position, for example. In this respect, the bending line describes the deformation of the bending beam/bending transducer 12. Alternatively, a type of torsion axis may also be present if the element 12 also twists, for example. The torsion axis is determined, for example, by the fact that torsion of the element 12 results along this axis. The torsion axis may extend longitudinally along the elongated bending beam 12, in accordance with the bending line 12b. The bending transducer 12 is provided with a screen 18. In this embodiment, the screen 18 extends along a side edge, namely on the side 12s1. For example, the screen 18 may start at the clamped end 12e and end at the free end 12f although any other length would also be conceivable. For example, the screen 18 projects substantially vertically out of the surface of the bending transducer 12 and/or into the same. In order to prevent stiffening of the bending transducer 12 along the bending line 12b and thereby make the movement B more difficult, the screen 18 is implemented to be flexible. This can be achieved, for example, by providing indentations or flexible elements 18f. These can be made of a flexible material or may also be realized as simple notches. The elements 18f make it possible to provide an element which is largely closed relative to the length of the side 12s1, but at the same time does not restrict the variability too much, at least for bending/torsion along/around bending line 12b. In detail, this flexibility may be realized by partially weakening the cross-section in order to achieve a flexible behavior along the bending line (18) B (lower bending stiffness) when compared to a non-weakened cross-section. This is achieved by a reduced area moment of inertia or partially weakened area moment of inertia starting from a partially reduced cross-section. Of course, the modulus of elasticity of the material could also be increased or partially increased instead of the reduced cross-section. The slots in the screen 18 have the advantage that they are easy to manufacture and thus the screen 18 may also be made from the same material as the bending beam 12, e.g. from a semiconductor material such as silicon. The one or more slots in the screen 18 form a kind of comb structure in the screen 18. The depth of the recesses, the number of recesses, the distance between the recesses and/or the width of the recesses have an influence on the flexibility introduced.

According to further embodiments, the screen 18 can also be provided on the side 12s2 or on both sides. Preferably, the screens 18 with the flexible structures are arranged on the sides, i.e. adjacent to the clamped side 12e. Here, the screens 18 with the flexible structures may be provided both on the side projecting out of the substrate plane, and on the side projecting into the substrate plane. According to a further embodiment, a screen can also be provided at the free end 12f both on the upper side and on the lower side.

The approach explained with reference to FIG. 1 with the flow screens 18, which are supported to be movable or flexible, directly on the bending transducers 12, offers, among other things, the advantages of improved and more favorable manufacturability since the screen elements can be formed directly from the substrate, for example, and thus no additional materials and process steps are required. In addition, the screen elements can fulfill further functions. According to embodiments, the stiffnesses or the stiffness curve along the screen 18 are implemented such that a kind of stiffening structure is created here, which at least partially stiffens the bending transducer 12, but still maintains its flexibility. This is used, for example, for mode decoupling and damping induction.

The screens and in particular their mode of operation will be now explained in detail with reference to FIGS. 2a-e.

Figure 2A:
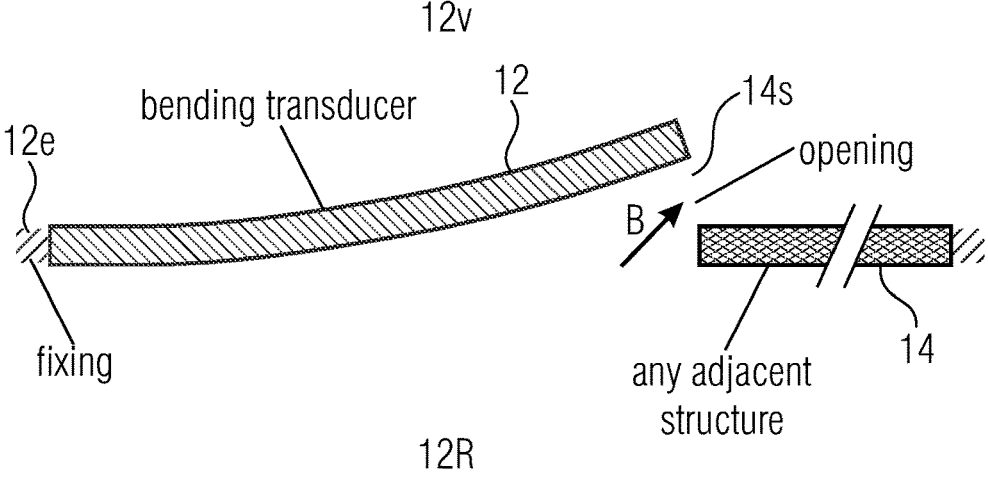
FIGS. 2a to e show a schematic illustrations for illustrating the concept of the "acoustic screen" to explain embodiments.

FIG. 2a shows a bending transducer 12 and an adjacent structure 14. Along the sides 12s1, 12s2 and 12f, the bending transducer 12 is separated from the structure 14 surrounding the bending transducer 12 by a gap. According to embodiments, this gap is formed to be extremely thin, for example in the range of <20 μm, <10 μm or even <5 μm (generally in the range of 0.1 or 1 μm to 20 μm). The bending transducer is also cantilevered at one end 12e and has a free end at the opposite end 12f. When the bending transducer 12 is deflected in direction B, the gap 14s opens and gapes open. This creates a large opening, which results in an acoustic short circuit between the back volume 12r and the front region 12v. This slot 14s serves for decoupling the elements 12 and 14.

Figure 2B:
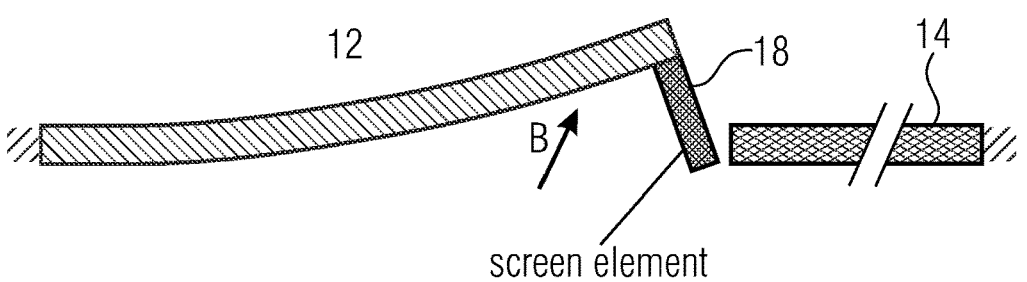

Screens 18 can be used to seal this gap 14s or the gaping opening, as is shown in FIG. 2b. The screen 18 here is arranged on the lower side (i.e. protruding into the substrate plane) of the bending transducer 12. With the same deflection in direction B, the screen element at least partially closes or significantly reduces the gap 12s between the bending transducer 12 and the structure 14. This helps to prevent acoustic short-circuiting. The functionality will be explained in detail below.

The bending transducer 12 is implemented to bend on the plane during operation and to displace the adjacent air or generate sound. To suppress a significant acoustic short circuit caused by a pressure-compensating air flow due to an enlarged opening in the deflected state (see FIG. 2a), the bending transducer 12 has at least one screen element 18 projecting vertically on the plane, which is mechanically separated from surrounding structures by a narrow decoupling gap 14s. The screen element 18 represents a comparatively smaller opening in the presented deflection range (see FIGS. 2a and 2b) and thus provides good acoustic separation between the front 12v and back 12r of the bending transducer 12.

Figure 2C:
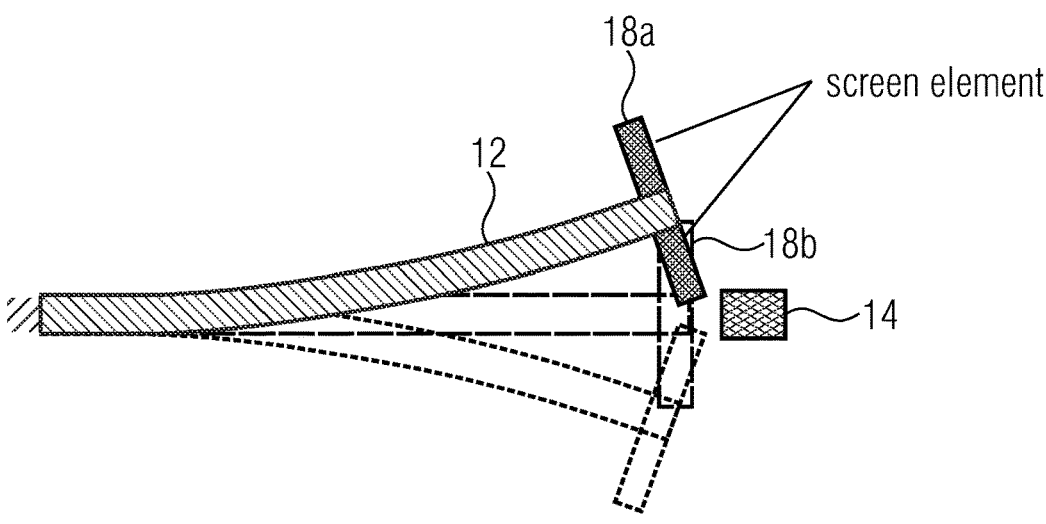

Depending on the application and direction of movement B of the bending transducer 12, the screen structures 18 can extend upwards and/or downwards from the plane, as is shown in FIG. 2c, for example. Here, two screen elements 18a and 18b are shown both above and below the bending transducer 12. This results, for example, in sufficient suppression of the acoustic short circuit even in symmetrical bending transducer operation (movement around the non-deflected rest position), as is shown by the three exemplary positions of the bending transducer 12. Especially the downward deflection could generate an acoustic short circuit in the present case of FIGS. 2a, 2b and 2c since the opposite structure 14 has a thickness comparable to the bending transducer 12 itself. By using the substrate as part of the screen structure, an asymmetrical screen, as is shown in FIG. 2b, for example, can also be used without generating acoustic short-circuiting. This configuration is shown in FIG. 2d.

Figure 2D:
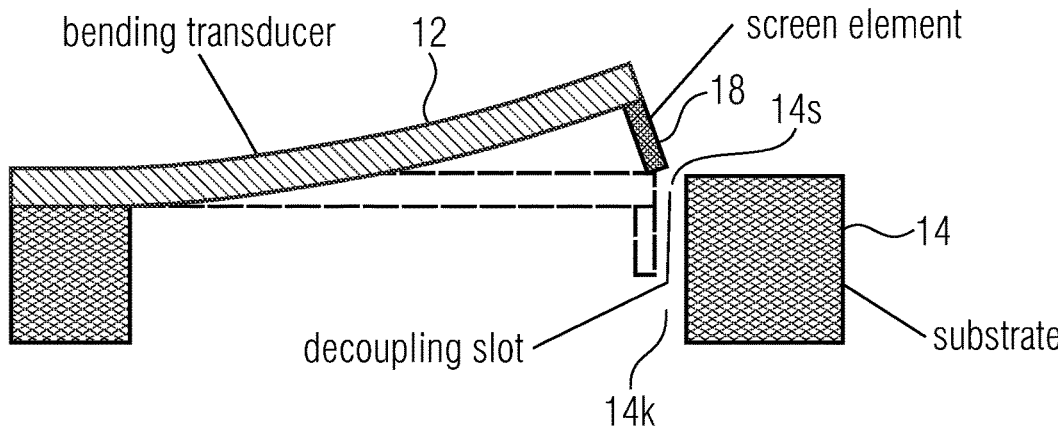

FIG. 2d shows a bending transducer 12 surrounded by a substrate 14. This substrate 14 has a cavity 14k. Here, the screen 18 is arranged asymmetrically, i.e. below the bending transducer 12 so that the slot 14s is sealed by the screen element 18 when deflected out of the substrate plane. When moving into the substrate plane, the cavity 14k has a sufficient depth so that the wall of the cavity 14k, i.e. the substrate 14 itself, forms a kind of screen and serves for sealing the slot 14s.

In this respect, the screen element may, for example, be formed from the substrate 14 itself or be realized by a separate integrated material. In addition, the substrate 14 may be used as a fixed screen element so that acoustic separation is maintained even with a downward bending transducer deflection.

Figure 2E:
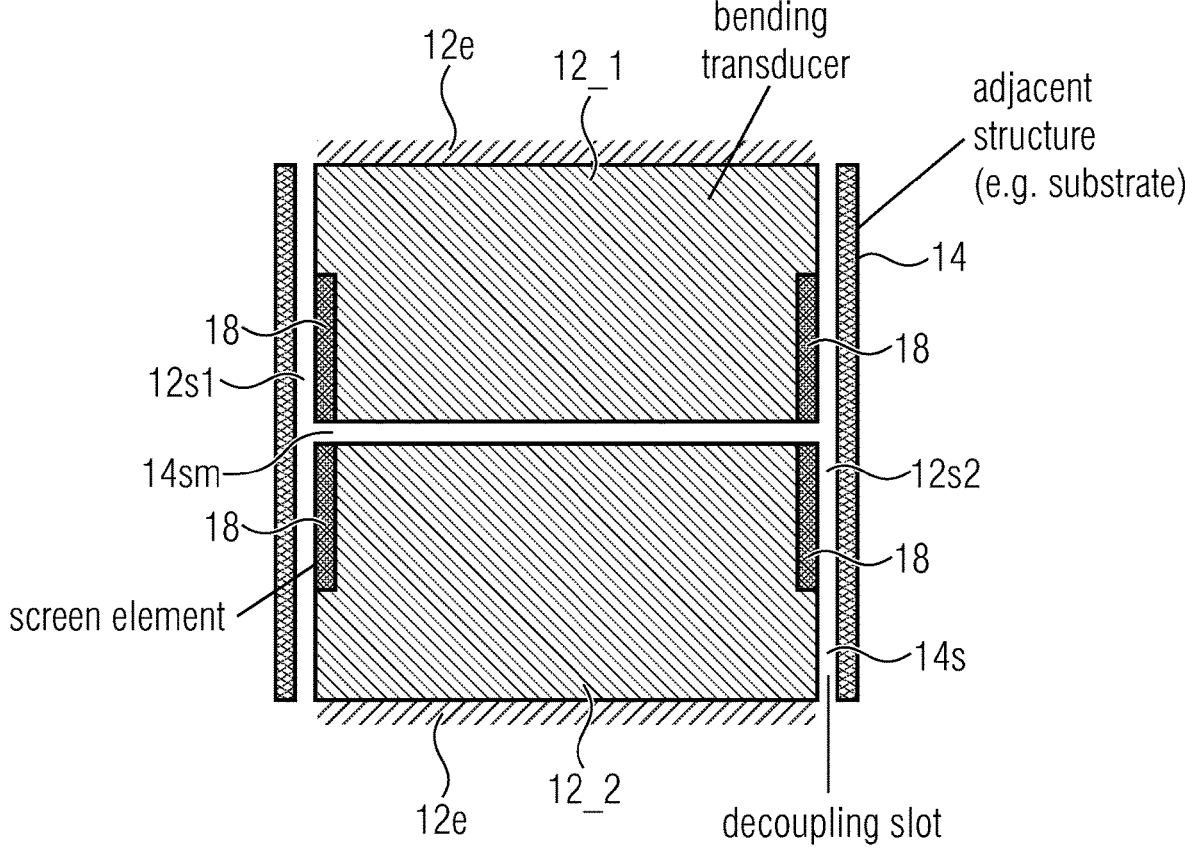

In order for the performance (deflection) of the bending transducer to be inhibited as little as possible, the screen elements can be designed flexibly, as is explained in connection with FIG. 1, or be omitted in less relevant areas, as is shown in FIG. 2e.

FIG. 2e shows a bending transducer 12 having two bending transducer elements 12_1 and 12_2 in top view. The two elements 12_1 and 12_2 are firmly clamped at opposite ends so that the free ends are adjacent to each other and form a gap 14sm between them. In this embodiment, the screens 18 are explained, which are arranged laterally, i.e. along the sides 12s1 and 12s2. In this embodiment, the screen 18 are always arranged only at the front end of the bending transducers 12_1 and 12_2, i.e. closer to the gap 14sm, than to the clamped end. The background here is that the flexibility in the region of the fixed clamping is maintained, while the region with the large stroke, where large openings occur, is sealed by the screen structures. In addition to the improved bending stiffness, the moving mass of the bending transducer 12_1 and 12_2 is also reduced.

Figure 3A:
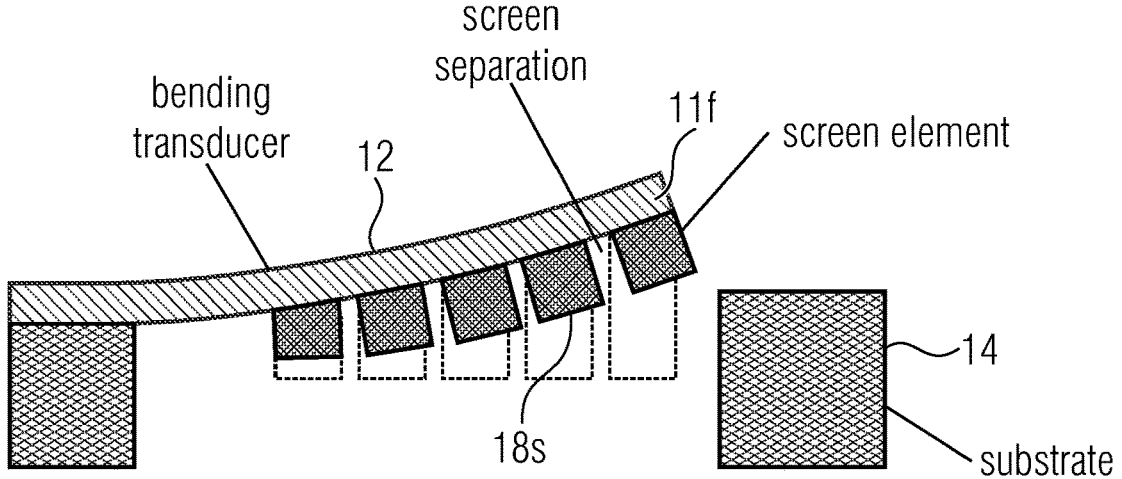
FIGS. 3a and b show schematic illustrations (cross-section and top view) of a sound transducer with separated screen elements according to extended embodiments.
Figure 3B:
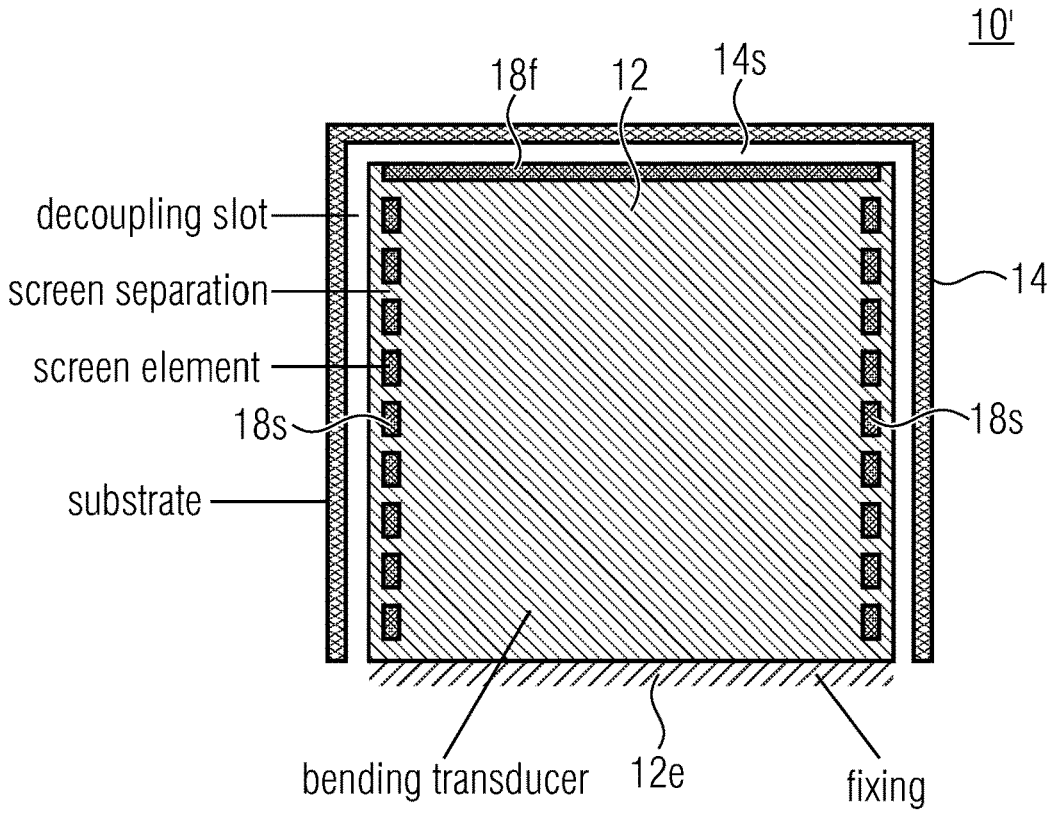

With reference to FIG. 3, a further variation will be explained: FIG. 3a shows a cross-section of an MEMS sound transducer 10', while FIG. 3b shows a top view. The bending sound transducer 12 is surrounded by a structure 14 and separated from it by a slot 14s arranged on three sides. The slot is also called a coupling slot, with screen elements 18s and 18f being provided on three sides.

The structure of the bending transducer 12 relative to the substrate is comparable to the setup in FIG. 2d, wherein the screen elements 18s are also arranged laterally, in addition to the screen element 18f at the free end 12f. In this case, the screen elements extend, for example, from the clamping region 12e to the free end 12f. As is shown here, the lateral elements 18s have several slots in order to reduce the bending stiffness. In this respect, the screen elements 18s are separated by slots in regions subject to bending stress. The screen separation is advantageously dimensioned similarly to the decoupling slots, i.e. the slots in the screens 18s have a similar size to the decoupling gaps 14s, e.g. 1 µm or 5 µm, generally in the range of 0.1 to 20 µm. As a result, the bending transducer 12 can have a lower bending stiffness despite the screen elements, without a significant acoustic short circuit occurring due to air flows by the screen separation.

Both the bending transducers and the screen elements can have almost any geometry, as is shown in connection with FIG. 4.

Figures 4A, 4B, 4C, 4D, 4E:
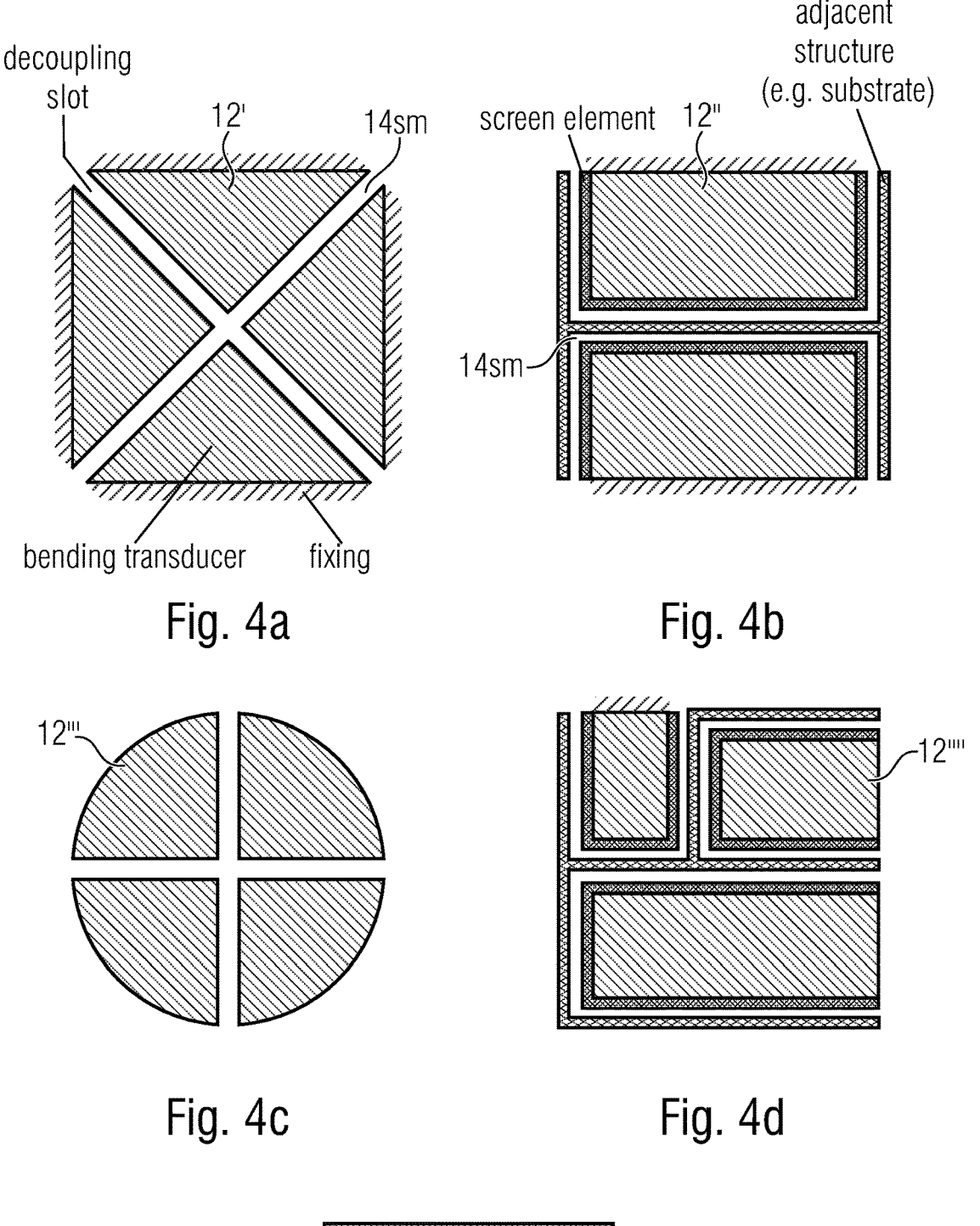
FIGS. 4a to e show schematic illustrations of further screen arrangements according to extended embodiments.
Figure 5A:
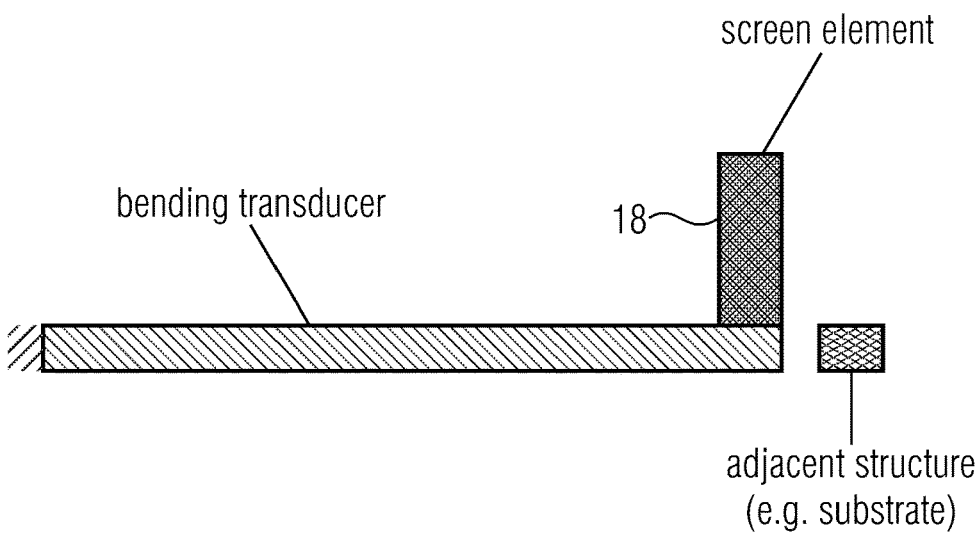
FIGS. 5a to c show schematic illustrations of a cross-section through a bending actuator according to embodiments.
Figure 5B:
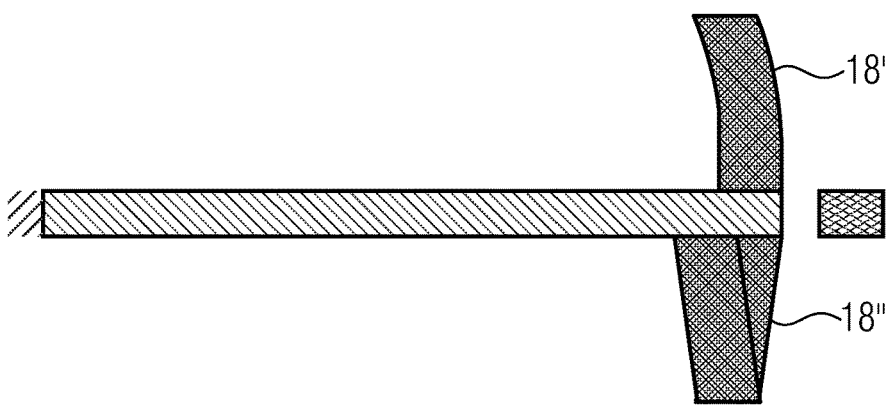
Figure 5C:
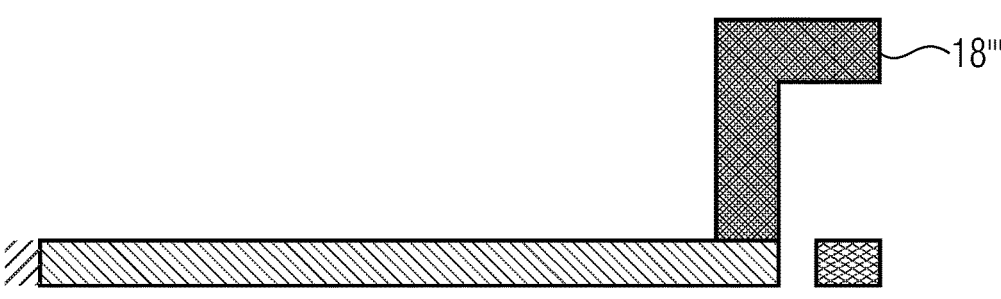

FIGS. 4a-e show four different arrangements of several bending transducers. FIG. 4a shows four triangular bending transducers 12' whose side edges (cathets) are separated by an intervening gap 14sm so that the four bending transducers 12' together form a rectangle or square. In FIG. 4b, two opposing screen elements 12" are provided, which are adjacent to each other at their free end and form the gap 14sm therebetween. FIGS. 4a and 4b each form a square shape, whereas the sound transducer in FIG. 4c has a round shape. Here, bending transducers 12''' are arranged in the form of 90° segments to form a circular segment. The arrangement in FIG. 4d has three different bending transducers with different sizes, each bending transducer being rectangular. All three bending transducers 12'''' are arranged such that a rectangle or square is formed. The bending transducer in FIG. 4e is clamped on two sides, namely on two opposite sides, which are provided with the reference numeral 12e. The other, also opposite sides, are free ends and each have a screen.

According to embodiments, several bending transducers can be combined with one another, e.g. to increase the generated sound pressure, to realize several sound sources which may be controlled phase- and amplitude-specifically (e.g. array for sound focusing) or to achieve sound generation in different frequency ranges (multi-way loudspeaker).

According to embodiments, the cross-section of the screen elements 18 is arbitrary. Preferably, the deflection is such that the decoupling slots are sufficiently narrow and constant over the relevant deflection range and that there is sufficiently good fluidic separation between the sound-transducing sides of the bending transducer. In addition, a defined mechanical stop may be realized via the screen elements, e.g. to prevent damage due to excessive deflection. This is shown in FIGS. 5a-d. Starting from the screen element 18 in FIG. 5a, different variations can be used. For example, a rounded or beveled and/or inclined screen element 18' or 18" can be inclined along the movement B (see FIG. 1). The screen element 18" is not only inclined, but also beveled. According to further embodiments, a kind of stop, e.g. as overload protection, can also be provided, as is shown by the screen element 18''' in FIG. 5c.

Figure 6A:
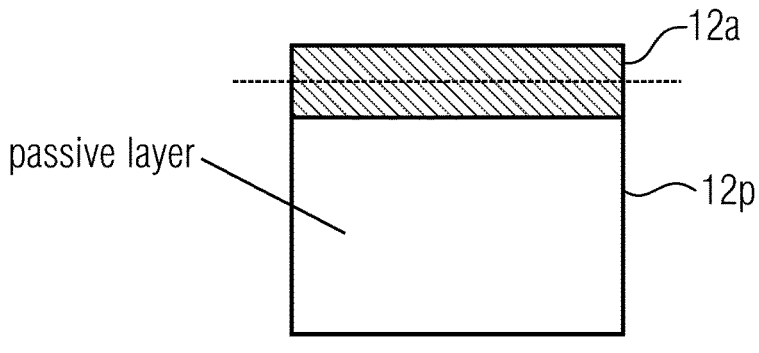
FIGS. 6a to c show schematic illustrations of various exemplary geometries of actuators according to embodiments.
Figure 6B:
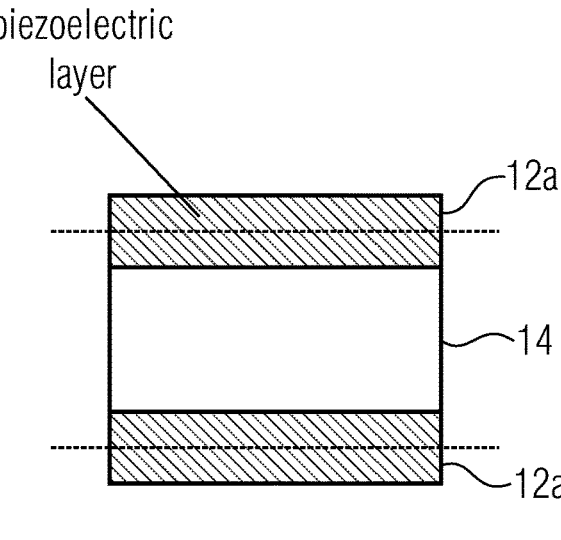
Figure 6C:
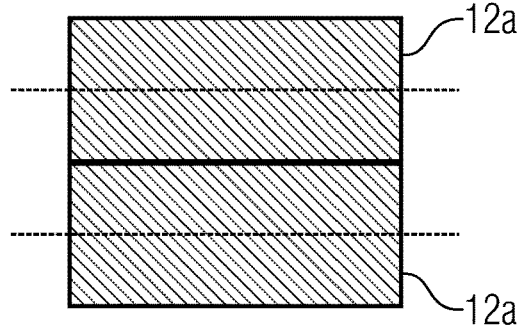

Regardless of the implementation, the bending transducers may be driven or read out piezoelectrically. Alternatively, electrostatic, thermal or magnetic conversion principles are also possible. In the piezoelectric conversion principle, the transducers consist of at least two layers, for example, as is shown in FIG. 6a. The two layers are a piezoelectric layer 12a and a passivation layer 12p. The piezoelectric layer may be implemented to be a multilayer system with additional separating layers, as is shown in FIG. 6b, for example. Here, two piezoelectric layers 12a with an intervening piezoelectric layer 12p are provided. Contact can be made, for example, via flat or interdigital electrodes. Viewed from the other side, this means that unimorph piezo layers, as in FIG. 6a, bimorphs with a passive intermediate layer (see FIG. 6b) or bimorphs without a passive intermediate layer (see FIG. 6c) may occur. The piezoelectric layers may be subdivided into any number of layers (see dashed line) and be provided with electrodes and separating layers (not shown).

In thermal conversion principles, the thermally active layers correspond to the piezoelectric layers.

The bending transducer structures described are suitable for areas of application in which sound is to be generated in a frequency range between 10 Hz and 500 kHz with the smallest possible component volumes (<10 cm³). This primarily applies to miniaturized loudspeakers for wearables, smartphones, tablets, laptops, headphones, hearing aids, but also ultrasonic transducers. Other applications in which fluids are displaced (e.g. fluid mechanical and aerodynamic drive and guide structures, inkjets) are also feasible. An application as a sensor element, e.g. microphone, is also conceivable.

When implemented as actuators, the bending transducers may have additional sensors which can be used to determine the deflection or phase. Since the bending transducers also form the sound-converting element, ageing effects and non-linearities can be measured directly during operation and, if necessary, compensated electronically. This is a major advantage over conventional membrane-based systems, where either no sensors are available or only the behavior at the drives can be detected, but not that at the sound-generating membrane element.

Detection is advantageously performed via the piezoelectric effect. For this purpose, one or more regions of the piezoelectric layer on the bending transducers can be provided with separate sensor electrodes, via which a voltage or charge signal approximately proportional to the deflection can be tapped. In addition, several piezoelectric layers can also be realized (FIG. 3.8), wherein at least one layer is partially used for detection. It is also possible to combine different piezoelectric materials, which are arranged either on top of or next to one another (e.g. PZT for bending transducers, AlN for sensors).

As an alternative to piezoelectric sensor elements, the integration of thin-film strain gauges or additional electrodes for capacitive detection is also possible. If the bending transducer structures are made of silicon, piezoresistive silicon resistors can also be integrated directly.

Further embodiments relate to a miniaturized sound transducer.

According to embodiments, the height and geometry of the screen element can be configured such that an acoustic short circuit is largely or completely prevented in the audio and ultrasonic frequency ranges (20 Hz to 300 kHz) by the gap.

According to embodiments, the gap width between the screen element and the surrounding structure can be formed to be sufficiently small to largely or completely prevent an acoustic short circuit in the audio and ultrasonic frequency ranges (20 Hz to 300 kHz) by the gap.

The gap may be as small as 20 μm, 10 μm or 5 μm, for example (alternative range between 20 μm and 0.1 μm). According to embodiments, the screen element may have a height of up to 800 μm, 400 μm, 200 μm, 50 μm, 5 μm or 1 μm.

According to embodiments, the one or more screen elements are separated from one another by narrow decoupling slots in order to keep the bending stiffness of the bending transducer as low as possible. According to further embodiments, the at least one screen element is implemented to be flexible in order to keep the bending stiffness of the bending transducer as low as possible.

According to embodiments, the sound transducer has two or more separate bending transducers, which can be electrically controlled or read out separately or together.

According to embodiments, the bending transducer is intended for generating sound in air or generally in gas. According to embodiments, the bending transducer can be driven piezoelectrically or electromagnetically. According to embodiments, the bending transducer has a sensor element for position and phase detection.

Parameters for an exemplary sound transducer are presented below.

| Parameters | Minimum/Maximum |
|---|---|
| First eigenmode | 10 Hz-500 kHz |
| Excitation frequency | static-1 MHz |
| Bending transducer area | $50 \times 50 \ \mu m^2$-$5 \times 5 \ cm^2$ |
| Decoupling slots | 0.1 μm-40 μm |
| Deflection amplitude | 0.01 μm-3 mm |

The materials used for the main functional elements may be:

| Function | Materials |
|---|---|
| Piezoelectric layer | PZT, PNZT, AlN, AlScN, ZnO, BCZT, KNN |
| Passive layer | Si, poly-Si, SiN, SiNO, SiO2, AlN, metals, polymers, glass |
| Flow screens | Si, metals, photoresists, polymers, glass |

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

LITERATURE

[1] Patent specification U.S. Pat. No. 10,349,182B2, "Mikromechanische piezoelektrische Aktuatoren zur Realisierung hoher Kräfte und Auslenkungen"

11

[2] Patent application EP 3632135A2, "Mikromechanis-cher Schallwandler"

[3] F. Stoppel, A. Männchen, F. Niekiel, D. Beer, T. Giese, B. Wagner, "New integrated full-range MEMS speaker for in-ear applications", IEEE Micro Electro Mechanical Systems (MEMS), 2018

[4] Patent specification U.S. Pat. No. 9,237,961 B2

[5] I. Shahosseini, E. Lefeuvre, J. Moulin, E. Martincic, M. Woytasik, G. Lemarquand, IEEE Sens. J. 13 (2013), pp. 273-284

[6] F. L. Ayatollahi, B. Y. Majlis, "Materials Design and Analysis of Low-Power MEMS Microspeaker Using Magnetic Actuation Technology", Adv. Mater. Res. 74 (2009), pp. 243-246

[7] Y. C. Chen, Y. T. Cheng, "A low-power milliwatt electromagnetic microspeaker using a PDMS membrane for hearing aids application", IEEE Int. Conf. Micro Electro Mech. Syst., 24th (2011), pp. 1213-1216

[8] M.-C. Cheng, W.-S. Huang, S. R.-S. Huang, "A silicon microspeaker for hearing instruments", J. Micromech. Microeng. 14 (2004), pp. 859-866

[9] S.-S. Je, F. Rivas, R. E. Diaz, J. Kwon, J. Kim, B. Bakkaloglu, S. Kiaei, J. Chae, "A Compact and Low-Cost MEMS Loudspeaker for Digital Hearing Aids", IEEE Trans. Biomed. Circ. Sys. 3 (2009), pp. 348-358

[10] B. Y. Majlis, G. Sugandi, M. M. Noor, "Compact electrodynamics MEMS-speaker", China Semiconductor Technology International Conference (CSTIC), 2017

[11] P. R. Jadhav, Y. T. Cheng, S. K. Fan, C. Y. Liang, "A sub-mW Electromagnetic Microspeaker with Bass Enhancement using Parylene/Graphene/Parylene Composite Membrane", IEEE Micro Electro Mechanical Systems (MEMS), 2018

[12] Albach, T. S., Horn, P., Sutor, A. & Lerch, R. Sound Generation Using a Magnetostrictive, Micro Actuator. J. Appl. Phys. 109 (7), (2011)

[13] B. Kaiser, S. Langa, L. Ehrig, M. Stolz, H. Schenk, H. Conrad, H. Schenk, K Schimmanz, D. Schuffenhauer, Concept and proof for an all-silicon MEMS micro speaker utilizing air chambers, Microsystems & Nanoengineering (2019)

The invention claimed is:

1. A Micro Electro Mechanical Systems, MEMS, sound transducer comprising:

a deflectable bending transducer element which is clamped on at least one side relative to a surrounding structure, the bending transducer element comprising a free end on at least one side, which is separated from the surrounding structure by a gap, wherein the deflectable bending transducer element is configured to be subjected to bending along a bending line and/or torsion along a torsion axis as a result of a force in order to be deflected as a result of the bending, wherein the deflectable bending transducer element comprises at least one screen structure which projects vertically from one of the main directions of extension of the bending transducer element and is implemented to be flexible at least along the bending line and/or along the torsion axis.

2. The sound transducer according to claim 1, wherein the deflectable bending transducer element extends in a first direction, and wherein the bending line or torsion axis extends along the first direction.

3. The sound transducer according to claim 1, wherein the surrounding structure and the deflectable bending transducer element are located in the same plane; and/or

wherein the deflectable bending transducer element extends in a plane along which the bending line and/or torsion axis runs in a rest state.

4. The sound transducer according to claim 1, wherein the flexibly implemented screen structure comprises one or more decoupling slots.

5. The sound transducer according to claim 4, wherein the one or more decoupling slots extend perpendicularly relative to the screen structure and/or are introduced into the screen structure such that the screen structure comprises a comb shape.

6. The sound transducer according to claim 4, wherein the one or more decoupling slots comprise a constant thickness and/or a constant spacing.

7. The sound transducer according to claim 1, wherein the deflectable bending transducer structure comprises screen structures on a first and/or a second main surface; and/or wherein the screen structure is curved and/or comprises a stop.

8. The sound transducer according to claim 1, wherein the gap comprises a thickness of <20 μm, <10 μm or <5 μm or generally comprises a thickness in the range of 0.1 μm to 20 μm.

9. The sound transducer according to claim 1, wherein the screen element comprises a height of at least 1 μm, at least 5 μm, at least 50 μm, at least 200 μm, at least 400 μm or at least 800 μm.

10. The sound transducer according to claim 1, wherein the deflectable bending transducer element comprises one or two flexible screens arranged adjacent to the clamped end; and/or wherein the deflectable bending transducer element comprises one or more screen elements which are arranged on one side opposite the clamped side and are formed not to be flexible.

11. The sound transducer according to claim 1, wherein the deflectable bending transducer comprises a piezo layer, a piezo layer and a passivation layer or two piezo layers with an intervening passivation layer, which are configured to provide the force.

12. The sound transducer according to claim 1, wherein the sound transducer comprises a further deflectable bending transducer element; or wherein the sound transducer comprises a further deflectable bending transducer element which is arranged opposite the deflectable bending transducer element so that the free ends of the deflectable bending transducer element and of the further deflectable bending transducer element form a gap; or wherein the sound transducer comprises a further deflectable bending transducer element which forms the surrounding structure.

13. The sound transducer according to claim 1, wherein the deflectable bending transducer element is only clamped in a single axis.

14. The sound transducer according to claim 1, wherein the sound transducer is configured to emit a sound signal upon excitation by an electrical signal.

15. The sound transducer according to claim 1, wherein the sound transducer is configured to provide an electrical signal as a function of a sound signal, starting from a sound signal incident on the deflectable bending transducer element.

* * * * *